United States Patent [19]

Someji et al.

[11] Patent Number: 5,254,212
[45] Date of Patent: Oct. 19, 1993

[54] METHOD OF FABRICATING ELECTROSTRICTIVE-EFFECT DEVICE

[75] Inventors: Takahiro Someji, Fukaya; Junichi Watanabe, Kumagaya; Yoshiyuki Watanabe, Fukaya; Shigeru Jyoumura, Tokyo; Katsuhiko Kojyou, Fukaya; Kazuo Kazama, Kumagaya; Kiyomi Tanaka, Oosato, all of Japan

[73] Assignee: Hitachi Metals, Ltd., Tokyo, Japan

[21] Appl. No.: 855,048

[22] PCT Filed: Sep. 9, 1991

[86] PCT No.: PCT/JP91/01196
§ 371 Date: May 6, 1992
§ 102(e) Date: May 6, 1992

[87] PCT Pub. No.: WO92/05593
PCT Pub. Date: Apr. 2, 1992

[30] Foreign Application Priority Data

Mar. 14, 1991 [JP] Japan ..................... 3-074592
Mar. 14, 1991 [JP] Japan ..................... 3-74593
Jun. 28, 1991 [JP] Japan ..................... 3-0158157
Sep. 13, 1991 [JP] Japan ..................... 2-242962

[51] Int. Cl.$^5$ ............................ B44C 1/22; C23F 1/00
[52] U.S. Cl. ............................ 156/630; 29/25.35; 156/634; 156/655; 156/656; 156/645
[58] Field of Search ............... 156/629, 630, 633, 634, 156/645, 651, 655, 656, 659.1, 663, 664; 29/25.35

[56] References Cited

U.S. PATENT DOCUMENTS 2,998,583  8/1961  Worcester ............... 156/656 X
5,163,209 11/1992  Harada et al. ........... 29/25.35

FOREIGN PATENT DOCUMENTS

58-196068 11/1983 Japan .
60-196981 10/1985 Japan .
1-147880   6/1989 Japan .
1-184968   7/1989 Japan .

Primary Examiner—William A. Powell
Attorney, Agent, or Firm—Finnegan, Henderson, Farabow, Garrett & Dunner

[57] ABSTRACT

A method of making a layered electrostrictive displacement device by forming sheets of an electrostrictive material alternately with internal electrodes. The laminate formed therefrom has two opposite surfaces at which the ends of the internal electrodes are exposed and two other opposite surfaces at which alternate layers of the internal electrodes are exposed. Temporary external electrodes are formed on the latter mentioned opposite surfaces. Alternate layers of the exposed portions of the internal electrodes are plated at one surface of the laminate with a metal while using a temporary external electrode as a cathode. The exposed portions of the other internal electrodes are plated with metal using another temporary external electrode as a cathode. The non-plated portions of the plated surface are selectively removed to form recesses, and an insulating film is formed on the recesses. Portions of insulating film and the metal deposited are removed to expose the internal electrodes, and external electrodes for connection to the exposed internal electrodes are formed.

6 Claims, 12 Drawing Sheets

METHOD OF FABRICATING ELECTROSTRICTIVE-EFFECT DEVICE

TECHNICAL FIELD

The present invention relates to a method of fabricating a lamination-type displacement device (which may be hereinafter referred to as an electrostrictive-effect device) consisting of a lamination of thin sheets of an electromechanical transducer material (that may be hereinafter simply referred to as an electrostrictive material) such as an electrostrictive material or piezoelectric material used for an actuator of an industrial robot, an ultrasonic motor, or the like, the thin sheets being laminated via internal electrodes to increase the amount of displacement. Especially, the invention is intended to selectively insulate the internal electrodes exposed at the side surfaces of the laminate with high reliability.

BACKGROUND ART

Conventionally, a lamination-type displacement device used for a displacement device which is employed in a positioning mechanism for an XY stage, brake, or the like has been manufactured by fabricating thin sheets of a piezoelectric ceramic material shaped in a given form, mounting electrodes on the thin sheets, polarizing them, and then bonding them together directly or via thin sheets of a metal with an organic adhesive. For devices having thin sheets using an adhesive as described above, the displacement induced by vibration of the piezoelectric device may be absorbed by the adhesive layer, depending on the working conditions. The adhesive may deteriorate at high temperatures or after the device has been used for a long time. In this way, devices of this kind have drawbacks.

For this reason, in recent years, lamination-type displacement devices fabricated by the same method as used to manufacture lamination-type chip capacitors have been put into practical use.

Figure 18:
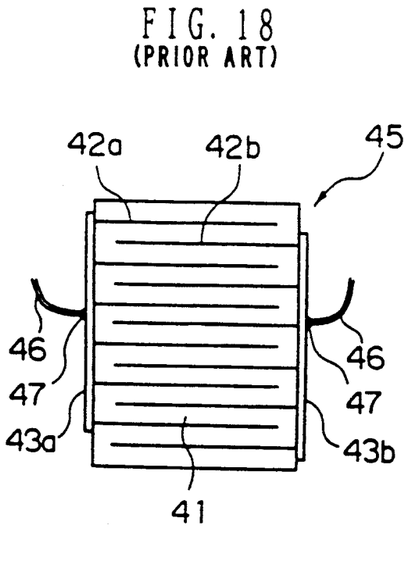
FIGS. 18 and 19 are pictorial views of conventional lamination-type displacement devices.

One example of the conventional lamination-type displacement device is constructed as shown in FIG. 18. In FIG. 18, thin sheets 41 are made of a piezoelectric ceramic material. Positive internal electrodes 42a alternate with negative internal electrodes 42b in such a way that these sheets are tightened together and stacked on top of each other to form a laminate 45. Each one fringe of the internal electrodes 42a and 42b is so formed as to be exposed. The exposed fringes are connected with external electrodes 43a and 43b extending in the direction of the lamination. Lead wires 46 are connected with the external electrodes via solder 47.

In the structure described above, when positive and negative voltages are applied to the external electrodes 43a and 43b, respectively, an electric field is set up between the internal electrodes 42a and 42b. The thin sheets 41 are elongated in the direction of thickness and produce displacement because of the longitudinal effect of the piezo-electric ceramic material. In this structure, however, the electric field strength is weaker in the marginal regions close to the side surfaces, i.e., in the regions where the internal electrodes 42a and 42b are not laid to overlap each other. Therefore, no deformation is produced. In addition, these portions serve to hinder the deformation of the whole device. Consequently, it is impossible to obtain the amount of distortion intrinsic to the electromechanical transducer material from such an alternate electrode type. Furthermore, the stress is concentrated at the boundary between the displacement portion and the non-displacement portion. If a high voltage is impressed or if a voltage is applied for a long time, the device will be destroyed.

Figure 19:
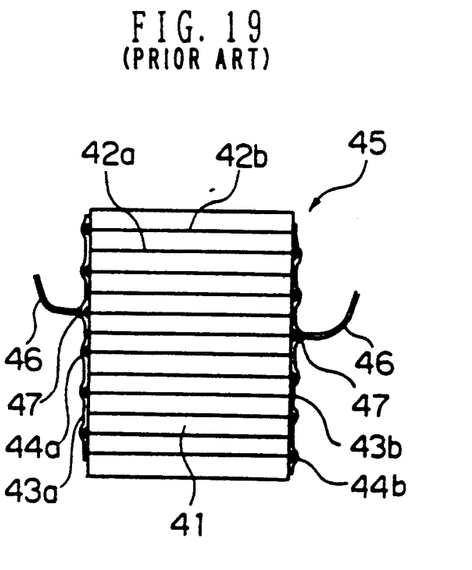

A lamination-type displacement device which is free from the foregoing drawbacks is shown in FIG. 19. This has an improved piezoelectric displacment efficiency, and is known as a so-called total surface electrode type (for example, see Japanese Patent Laid-Open No. 196068/1983). In FIGS. 18 and 19, like components are indicated by like reference numerals. Internal electrodes 42a and 42b are formed over the whole surface of each thin sheet 1. A desired number of thin sheets are laminated in the same way as in the foregoing to form a laminate 45. At one side of the laminate 45 fabricated as described above, a coating 44a of an insulating material is formed on alternate layers, e.g., on only the internal electrodes 42b, at the ends of the internal electrodes 42a and 42b. An external electrode 43a made of an electrically conductive material is formed on the coating 44a. At the other side of the laminate 45, a coating 44b is similarly formed at the ends of the internal electrodes such as 42a not covered with the coating 44a. An external electrode 43b is formed on the coating 44b. This structure operates similarly to the structure shown in FIG. 18 except that non-displacement portions are substantially absent. Therefore, this structure produces more uniform deformation than the structure shown in FIG. 18, and less concentration of stress occurs. In consequence, a large amount of distortion intrinsic to the electromechanical transducer material can be derived. On deformation, destruction does not take place.

In the electrostrictive-effect device structure utilizing the longitudinal effect as described above, it is effective to adopt a so-called total surface electrode structure, i.e., having internal electrodes of the same cross-sectional area as that of the electrostrictive effect device, for preventing concentration of stress on generation of a distortion. In order to produce a strong electric field and a large distortion at a low voltage, it is desired to make the spacing between the internal electrodes as small as possible. In other words, it is desired to reduce the thickness of the electrostrictive material to a minimum. In the present circumstances, it is desired to make the thickness less than 100 μm. However, a special contrivance is needed to electrically connect the alternate internal electrodes having the same cross-sectional area as that of the device in parallel.

In particular, in a laminate device fabricated by the same method as used to manufacture a laminate capacitor, the spacing between the neighboring electrodes is tens of microns to hundreds of microns. Moreover, the thickness of the exposed electrodes is only several microns. Therefore, it is quite difficult to bring out electrodes, or lead wires, from the alternate layers.

An electrical connection method which solves this problem is proposed in Japanese Patent Laid-Open No. 196981/1985. This method is characterized in that alternate belt-like portions of the end surfaces of the internal electrodes exposed at the side surfaces of a laminate of such an electrostrictive material are plated with a metal.

Figure 20:
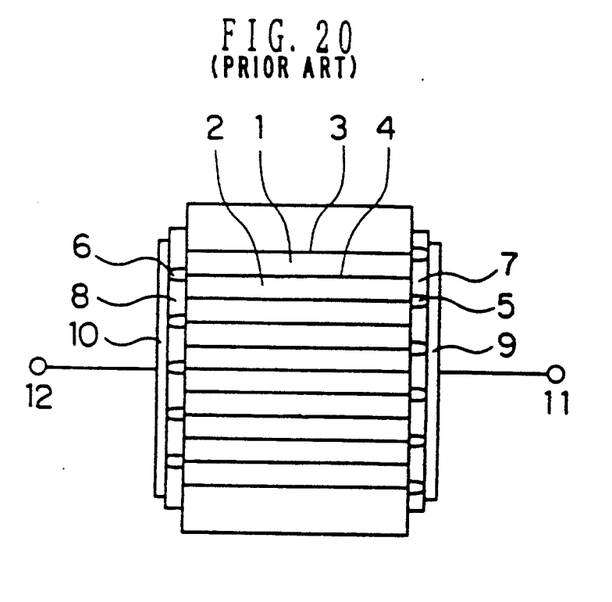
FIG. 20 is a cross-sectional view of a lamination of the prior art construction.

FIG. 20 is a vertical cross section of an electrostrictive-effect device connected by this method.

Figure 21:
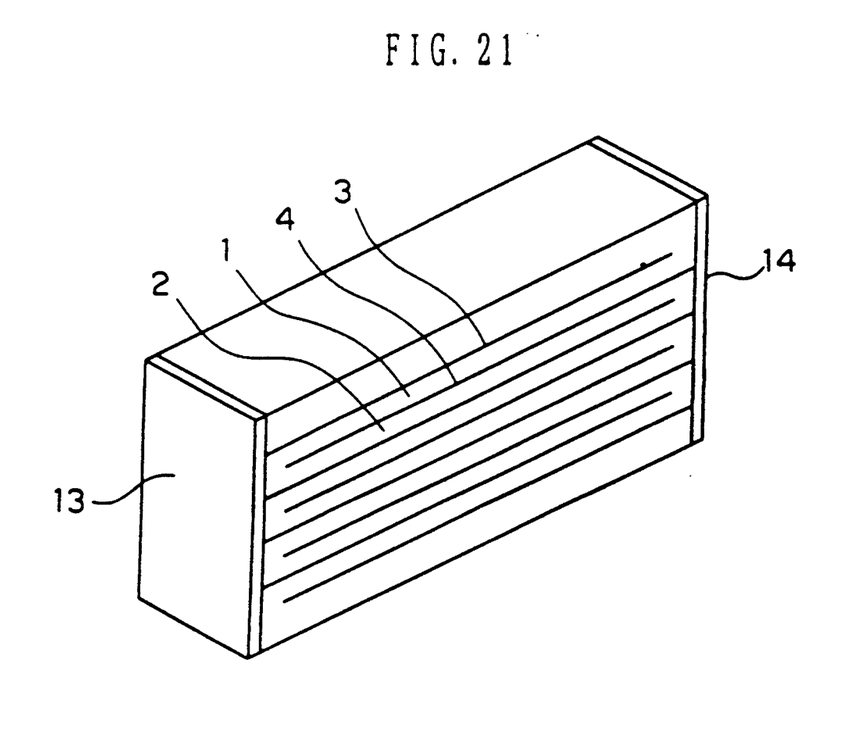
FIG. 21 is a perspective view of an alternate electrode laminate block having temporary external electrodes.

The method of fabricating the electrostrictive-effect device shown in FIG. 20 is first described. A laminate in which electrostrictive materials 1, 2 alternate with internal electrodes 3, 4 as shown in FIG. 21 is fabricated by applying the techniques for manufacturing laminate ceramic capacitors. The numerous internal electrodes 3 and 4 are exposed at the front and rear surfaces which are opposite side surfaces. The internal electrodes are connected with alternate layers of two temporary external electrodes 13 and 14 which are formed on the two other opposite side surfaces. This laminate and a metal plate acting as a counter electrode are placed in a plating bath. A DC voltage is applied to the temporary external electrodes 13 and 14 from this metal plate. The metal ions charged positively inside the plating bath are deposited on the internal electrodes 3 and 4. As a result, as shown in FIG. 20, the metal is deposited at 5 and 6.

Figure 22:
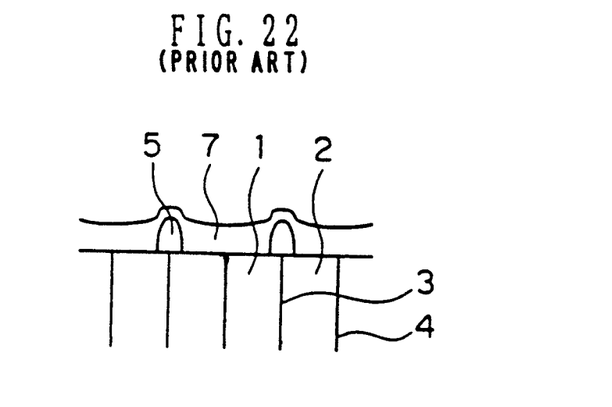
FIG. 22 is a schematic view showing a step for machining a lamination of the prior art construction.

Then, insulating films 7 and 8 are formed on the surface on which the metal is deposited at 5 and 6. FIG. 22 is a fragmentary horizontal cross section of the laminate having the deposited metal 5 on which the insulating film 7 is formed.

Figure 23:
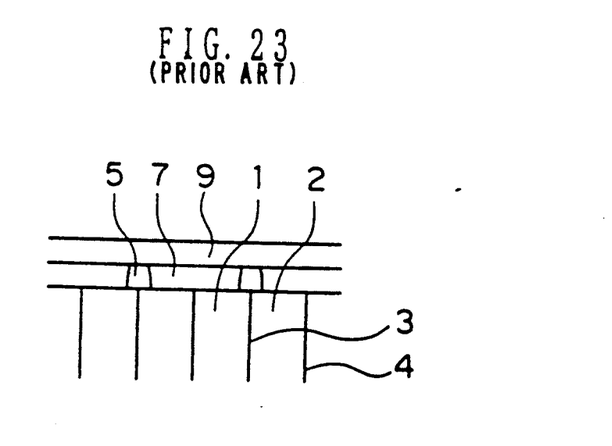
FIG. 23 is a schematic view showing another step for machining a lamination of the prior art construction.

Subsequently, the insulators 7 and 8 on the deposited metal at 5 and 6 are scraped off until the metal is exposed. Then, as shown in FIG. 23, an external electrode 9 is formed on the surface on which the deposited metal 5 and the insulating film 7 are formed. Thus, alternate layers of the multiplicity of electrodes inside the device are connected together. This laminate is cut parallel to the plane containing the temporary external electrodes 13 and 14. Thus, an electrostrictive-effect device is obtained except for small portions around both ends, the external electrodes being attached to the small portions. A DC voltage is applied between the external electrodes. In this way, the device can be activated.

Generally, electrostrictive materials are sintered in oxidizing ambients and so internal electrodes are made of precious metals such as silver/palladium, platinum, or other material that is not easily oxidized. On the other hand, the plating material used for connection with an external electrode is a base metal, since it is necessary that the deposited metal be ionized. In the device of the above-described structure, therefore, if the device is placed in a high-temperature condition or other condition to form the insulating layer or external electrode, the deposited metal is oxidized. Then, the electrical conduction is hindered, or a mechanical breakage takes place. In the worst case, the insulating layer around the deposited metal cracks because of cubic expansion caused by the oxidization. The result is that the insulation resistance decreases.

In an attempt to solve the aforementioned problem, the present inventor and others formed the external electrode in a reducing ambient. However, a new problem occurred. That is, the electrostrictive material was also deoxidized. A further method may be contemplated in which a noble metal not oxidized is caused to precipitate by plating. However, this method poses problems. For example, where silver is used, the insulation resistance drops due to migration. Where platinum, palladium, or the like is employed, the electrostrictive material is corroded by the plating liquid. Also, the usage of insulating layers and external electrodes which can be formed out of organic resins at relatively low temperatures may be contemplated. Nonetheless, it is difficult to put this method into practical use, because there is a possibility that some problems take place. In particular, after the device is used for a long time, it is deteriorated. Also, the device is deteriorated by moisture. Furthermore, the mechanical strength deteriorates at high temperatures.

Figure 24:
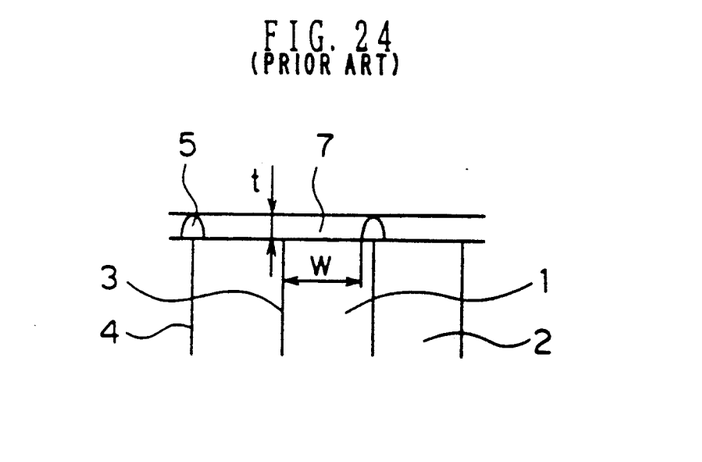
FIG. 24 is a view illustrating the problem with a device of the prior art structure.
Figure 25:
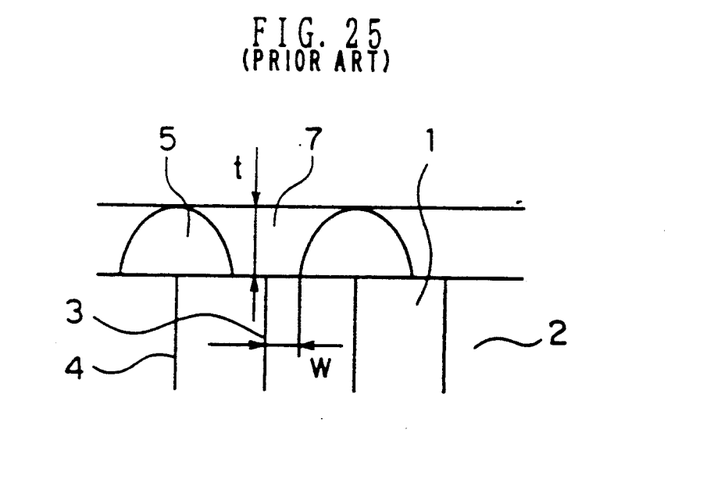
FIG. 25 is a view illustrating the problem with another device of the prior art structure.

In the above-described method making use of metal protrusions formed by plating, the thickness of the insulating layer depends on the height of the metal protrusions formed by plating and so it is impossible to obtain an insulating layer of a sufficient thickness. Specifically, as shown in FIG. 24, let t be the thickness of an insulating layer 7. Let W be the distance between a deposited metal 5 and an internal electrode 3 which differs from the metal in electrical polarity. Increasing the distance W provides better insulation. However, if the width of the deposited metal 5 is made small in order to increase the distance W between the deposited metal 5 and the internal electrode 3, then the height of the deposited metal 5 is reduced. Hence it is impossible to make the thickness t of the insulating layer 7 have a sufficiently large value. On the other hand, as shown in FIG. 25, if the deposited metal 5 is grown sufficiently to increase the thickness t of the insulating layer 7, then the width of the deposited metal 5 increases, thus reducing the distance W between the deposited metal 5 and the internal electrode 3. Consequently, a distance sufficient for insulation cannot be obtained.

The present invention is intended to solve the foregoing problems. The invention provides a method of selectively insulating internal electrodes with high reliability.

DISCLOSURE OF THE INVENTION

In a method of solving the foregoing problems in accordance with the present invention, a laminate is formed by forming electrostrictive-effect layers alternately with internal electrodes such that the laminate has two surfaces (normally these two surfaces are opposite to each other) at which the ends of the internal electrodes are exposed and two other surfaces at which alternate layers of the internal electrodes are exposed. Temporary external electrodes are formed on the latter two surfaces.

Then, alternate layers of the exposed portions of the internal electrodes at one surface of the laminate are plated with a metal while using one temporary external electrode as a cathode. Similarly, alternate layers of the exposed portions of the internal electrodes at another surface of the laminate are plated with a metal while using the other temporary external electrode as a cathode. Subsequently, the alternate layers of the exposed internal electrodes which are not plated and surrounding portions are removed by an appropriate means, followed by formation of an insulating film on the plated surface. Thereafter, portions of the insulating film and portions or all of the deposited metal are removed by an adequate means such as machining to expose the deposited metal or the ends of the internal electrodes. Finally, the external electrodes are formed to connect together alternate layers of the internal electrodes.

In accordance with the present invention, one example of the means for removing the alternate layers of the exposed portions of the internal electrodes not plated with the metal and the surrounding portions is a well-known machining such as a machining using dies. However, the present inventor and others have discovered that shot blasting can be used as a more preferable means.

Figure 3:
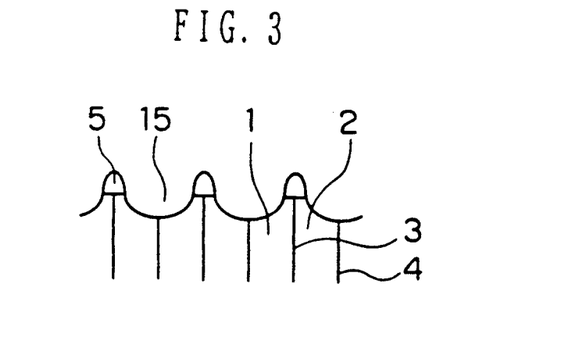
FIG. 3 is a schematic diagram showing a machining step according to the invention.

More specifically, abrasive grains of alumina ($Al_2O_3$), silicon carbide (SiC), silicon oxide ($SiO_2$), or other material are used to selectively grind the surface excluding the nickel plating at 5 and 6 by bombardment of the abrasive grains. As shown in FIG. 3, curved recesses 15 are formed.

In the above structure, even if the height of the metal protrusions formed by the plating is small, a sufficient thickness of insulating layer can be obtained by making the recesses deep.

In accordance with the present invention, after the laminate on which the temporary external electrodes are formed is prepared, the electrostrictive material on the surface (the surface at which the ends of substantially all the internal electrodes are exposed) not having the temporary external electrodes is partially etched away to thereby cause the internal electrodes to protrude. In this case, the ends of the internal electrodes protrude. The metal is deposited on these ends by plating. Therefore, the deposited metal adheres more firmly. In consequence, a more reliable device can be realized.

Also in accordance with the present invention, a method of removing the metal protrusions deposited by plating can be adopted.

One example of this method of removing the metal protrusions is as follows. After the portions between the metal protrusions are removed by a machining process as described above to form recesses, an insulating film is formed. Then, metal protrusions are fully removed by grinding or other method. Alternate layers of the internal electrodes are exposed. Subsequently, external electrodes are formed to connect alternate layers of the internal electrodes.

Another method is carried out in the manner described now. After the insulating film is formed, portions of the insulating film and portions of the deposited metal are removed by an appropriate means such as machining to expose the deposited metal. Then the exposed metal is then dissolved away to expose alternate layers of the internal electrodes. Finally, external electrodes are formed. Alternate layers of the internal electrodes are connected.

In accordance with the present invention, the deposited metal that is a base metal can be fully removed. When the external electrodes are formed, the device is heated to a high temperature. In spite of this condition, substantially no oxide film is formed. Hence it is unlikely that imperfect electrical contact is caused by such oxide film or that a mechanical breakage occurs.

Furthermore, in accordance with the present invention, the internal electrodes which are caused to protrude by etching are plated with a metal to increase the height of the protrusions. Therefore, a sufficient thickness of insulating layer can be derived. At the same time, the area of the portions of the internal electrodes in contact with the deposited metal is increased. This improves the adhesive strength. Additionally, the distance between the insulating layer and the electrostrictive-effect layer which goes to the internal electrodes differing in electrical polarity from the deposited metal can be increased substantially. Consequently, the reliability of the insulation is enhanced.

BRIEF DESCRIPTION OF THE DRAWINGS

FIGS. 16, (a)–(i), are perspective views and pictorial cross sections showing maching steps (a)–(i) of a first embodiment;

BEST MODE FOR CARRYING OUT THE INVENTION

The present invention is hereinafter described in detail, using its embodiments.

EXAMPLE 1

FIGS. 16, (a)–(i), are perspective views illustrating machining steps of this example and pictorial cross sections.

Figure 16A:
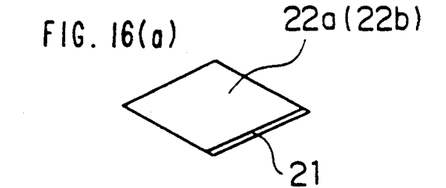
Figure 16B:
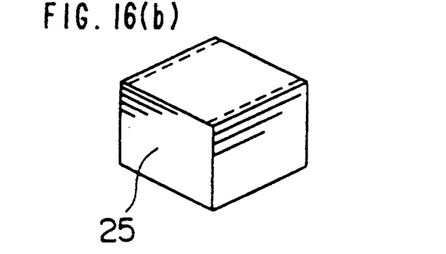

First, a sheet of an electromechanical transducer material having a thickness of, for example 100 $\mu$m, is cut into a thin square sheet 21, for example, 47 mm square as shown in FIG. 16(a). Conductive platinum paste or silver-palladium paste is printed to form internal electrodes 22a or 22b such that a margin 2 to 3 mm wide is left on one side. One hundreds, for example, of the sheets 21 are stacked alternately to form a laminate 24 as shown in FIG. 16(b). The binder of this laminate 25 is removed and then sintered at a given temperature.

Figure 16C:
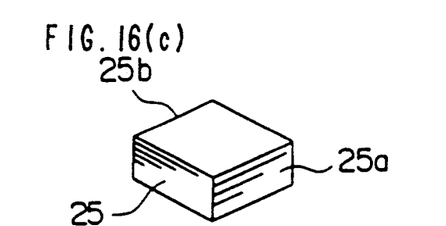
Figure 16D:
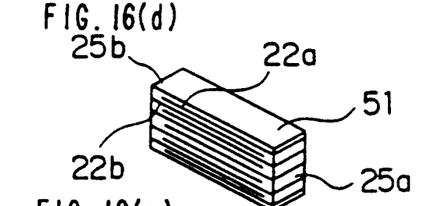
Figure 16E:
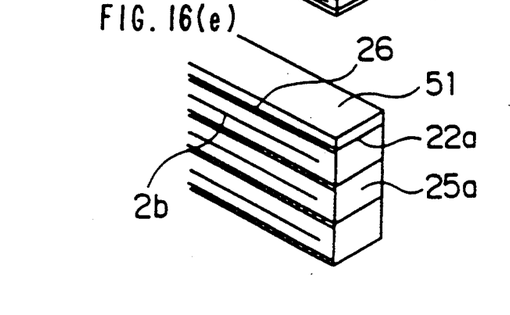

The resulting laminate 25 is shown in FIG. 16(c) and 40 mm square, for example. This laminate 25 is cut at intervals of, for example 5 mm, in such a way that alternate electrodes 25a and 25b of this laminate 25 are left. A laminate 51 in the form of a block as shown in FIG. 16(d) is obtained. The fringes of the internal electrodes 22a and 22b of the laminate 51 are exposed at the side surfaces excluding the alternate electrodes 25a and 25b. In FIG. 16(e), a protective film 26 is made of glass, silica, or other similar material and formed at and near the ends of the internal electrodes 22a. With respect to the other opposite side surface, a similar protective film is formed at and near the ends of the internal electrodes 22b.

The protective film 26 can be formed by electrophoresis, for example. Specifically, adhesive tape or the like is first stuck to the side surfaces on the rear side of the laminate 51 shown in FIG. 16(e) to coat the exposed fringes of the internal electrodes 22a and 22b. Then, temporary external electrodes (not shown) are formed on the alternate electrodes 25a. The laminate 51 is immersed in a suspension containing powdered glass. A counter electrode plate (not shown) is disposed ahead of the side surfaces on the front side. A DC voltage of, for example 10 to 200 V, is applied between this counter electrode plate and the aforementioned temporary external electrodes. Positively charged powdered glass undergo a force from the electric field directed from the counter electrode plate to the fringes of the internal electrodes 22a, move through the suspension, and adhere to the fringes of the internal electrodes 22a and their surroundings. In this case, no voltage is applied to the internal electrodes 22b and, therefore, no powdered glass adheres to them. In this way, the protective film 26 can be formed only at and near the ends of the internal electrodes 22a. The laminate 51 is then pulled from the suspension, and the protective film 26 is fixed.

In order to fix the protective film 26, it may be sintered after dried. Also, the glass may be temporarily held, using a quick setting adhesive or the like. Then, a protective film is formed similarly on the rear side by the same means. In particular, in FIG. 16(e), the side surfaces on the rear side are coated with adhesive tape or the like. Temporary external electrodes (not shown) are formed on the alternate electrodes 25b shown in FIG. 16(d), followed by immersion of the laminate 51 in the above-described suspension. A counter electrode plate (not shown) is disposed before the side surfaces on the rear side. A DC voltage is applied between the counter electrode plate and the temporary external electrodes to form a similar protective film at and near the ends of the internal electrodes 22b.

Figure 16F:
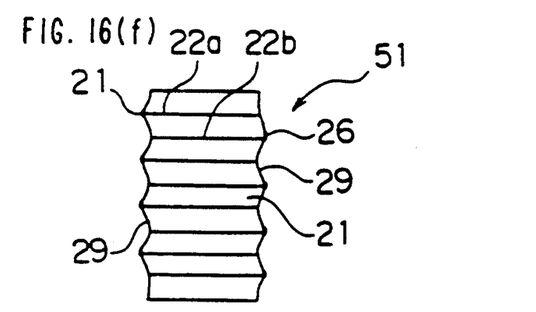
Figure 16G:
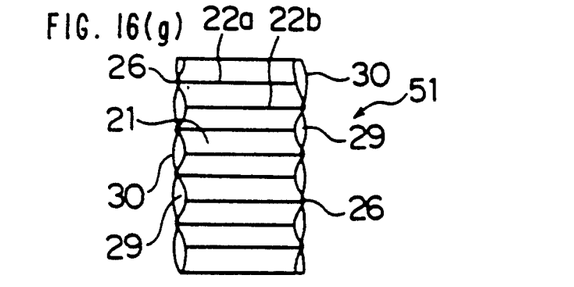
Figure 16H:
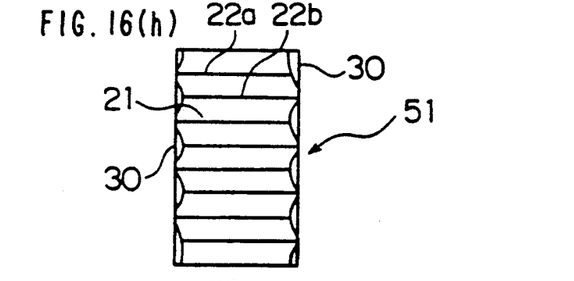
Figure 16I:
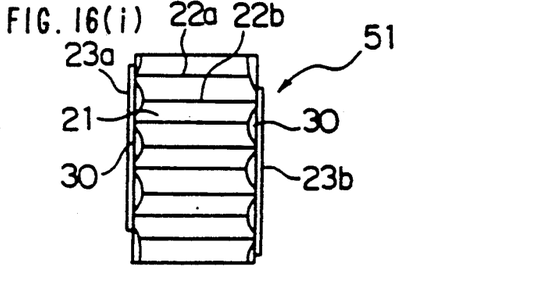

The laminate 51 having the protective films 26 formed at the ends of the internal electrodes 22a and 22b is machined by shot blasting. Specifically, plural laminates 51 and glass beans or abrasive grains of $Al_2O_3$, SiC, $SiO_2$, or other substance are used. Grooves or recesses are formed by bombardment of the abrasive grains. By this short blasting, the surface other than the protective film 26 is selectively ground by collision and friction of the abrasive grains to form curved recesses 29 as shown in FIG. 16(f). Then, as shown in FIG. 16(g), an insulating material such as glass is applied to, or printed on, the inner surfaces of the recesses 29 to form insulating layers 30. As shown in FIG. 16(h), both side surfaces are lapped to partially remove the protective films 26 and the insulating layers 30. By this lapping, alternate layers at the ends of the internal electrodes 22a and 22b are again exposed at the side surfaces of the laminate 51. As shown in FIG. 16(i), external electrodes 23a and 23b are formed for connection with their respective internal electrodes 22a and 22b.

Figure 17:
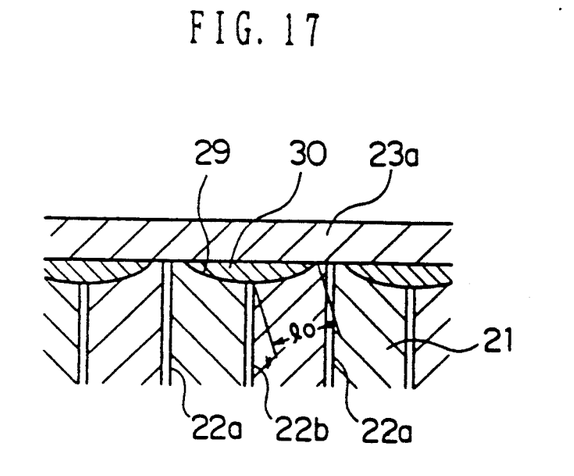
FIG. 17 is an enlarged cross section showing that portion of a lamination-type displacement device which is close to one external electrode, the device being fabricated in accordance with the first embodiment.

FIG. 17 is an enlarged cross section showing that portion of the lamination-type displacement device formed as described above which is close to the external electrode 23a. As can be seen from this figure, the distance $l_o$ between the external electrode 23a and the fringe of each internal electrode 22b is taken along the curved surface of the corresponding recess 29, the internal electrode 22b being located on the opposite side of the insulating layer 30 from the external electrode 23a. This distance can be set larger than the distance between the internal electrodes 22a and 22b. Therefore, the dielectric strength can be improved. Also, the distance $l_o$ taken along the curved surface can be made substantially uniform, since the recesses 29 are formed substantially uniformly along the fringes of the internal electrodes 22a and 22b. In this way, a reliable lamination-type displacement device can be fabricated.

In the present example, the material of the protective films which coat the exposed portions of the internal electrodes is powdered glass or silica. The protective films can be made from other materials. Any other material can be used as long as it is left during the subsequent step in which the side surfaces other than the protective films are selectively polished. In the above example, the protective films are formed by electrophoresis. The invention is not limited to this method. Screen printing and other means may be adopted. Also, the means for forming the recesses over which the insulating layers should be formed can be other than shot blasting. Any other means may be utilized as long as the side surfaces other than the protective films of the laminate can be selectively polished.

In the present example, when the laminate takes the form of a block before the device is completed, the insulating layers and the external electrodes can be formed. Therefore, it is easy to handle. Also, the machining efficiency can be enhanced. In addition, the distance between the electrodes is taken along the curved surfaces and so can be set larger than the distance between the internal electrodes. Hence, the dielectric strength can be improved.

EXAMPLE 2

Figure 1:
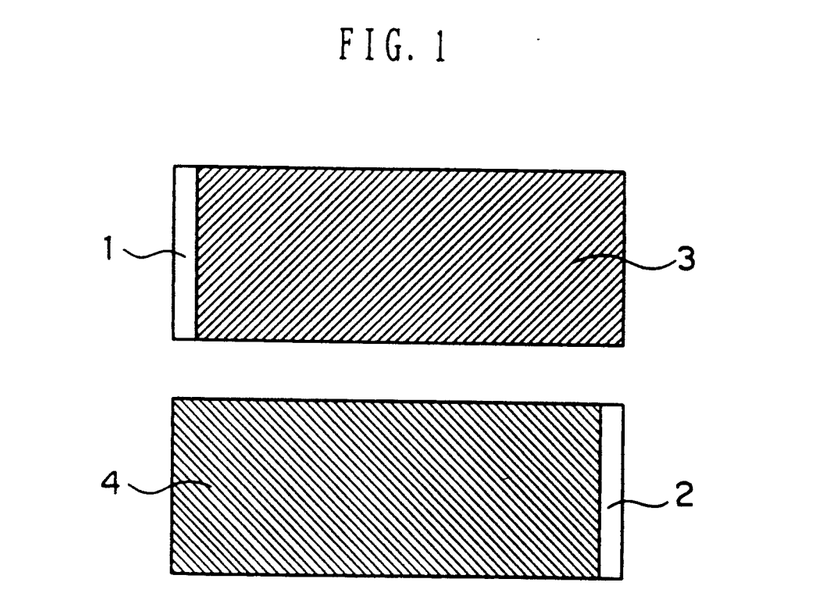
FIG. 1 is a view showing the pattern of internal electrodes formed in an alternate electrode laminate block according to the invention.

PVB was added as an organic binder to a powdered electrostrictive material consisting mainly of Pb (Zr, Ti)$O_3$-Pb(Mg, Nb)$O_3$. BPBG was added as a plasticizer to the powdered material. Trichlene was added as an organic solvent to the powdered material. The powder was mixed up to form a slurry. This slurry was applied to Mylar film with a doctor blade to form a sheet 100 μm thick. This sheet was peeled from the film. Platinum paste was printed on one side of this sheet in the pattern shown in FIG. 1 to form internal electrodes 3 and 4. These electrodes were stacked successively, heated, and bonded together under pressure. Then, the binder was removed. The laminate was sintered at 1100° to 1250° C. for 1 to 5 hours. As a result, a laminate was formed in which the alternate layers of the internal electrodes were exposed at right and left side surfaces, as shown in FIG. 21. Temporary external electrodes 13 and 14 were formed on both side surfaces.

One of the side surfaces of the laminate not having the temporary external electrodes was masked by a masking reagent and then the opposite surface was plated with a metal.

The composition of the plating liquid was so determined that 300 g of nickel sulfate, 45 g of nickel chloride, and 45 g of boric acid were contained per liter of pure water. The laminate and a counter electrode made of nickel were immersed in this plating liquid. The temporary external electrodes were connected with the positive terminal, while the counter electrode was connected with the positive terminal. A DC voltage was applied at a current density of 40 A/cm$^2$ for 20 minutes. As a result, belts of nickel plating, indicated by 5, each having a height of 30 $\mu$m and a width of 40 $\mu$m were formed on alternate layers of the internal electrodes.

The masked side surfaces on the rear side were also plated with nickel in the same way.

Figure 2:
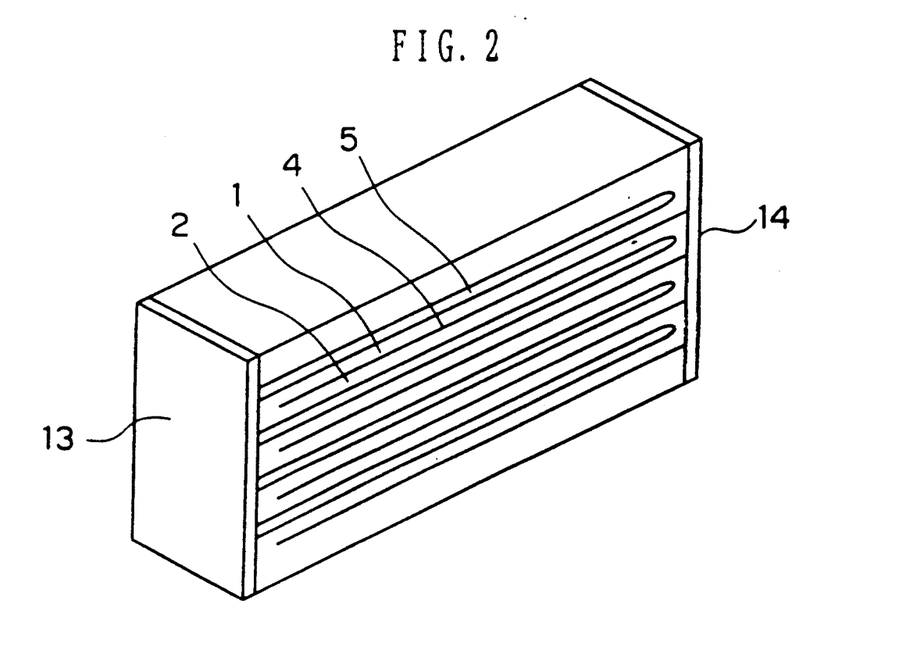
FIG. 2 is a view of the alternate electrode laminate block, and in which alternate layers are plated with a metal.

FIG. 2 is a perspective view of the laminate plated with nickel. In this figure, indicated by numeral 5 are belt-like deposits of nickel.

Then, the laminate in which the fringes of the internal electrodes 3 and 4 were plated with nickel as indicated by 5 and 6, respectively, was machined by shot blasting. For example, abrasive grains of Al$_2$O$_3$ of grain size #400 were used. The shot blasting operation was carried out for 60 seconds to form recesses 100 $\mu$m deep.

Figure 4:
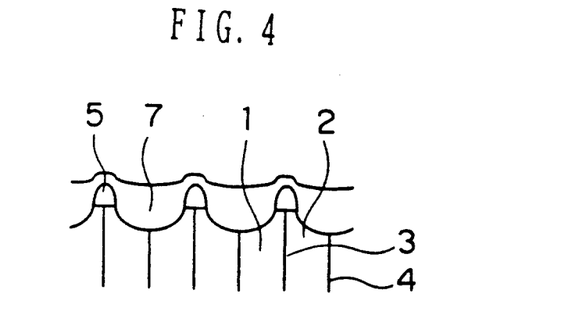
FIG. 4 is a schematic diagram showing another machining step according to the invention.

As shown in FIG. 4, an insulating material was applied to the shot-blasted surface and baked to form an insulating layer 7.

Figure 5:
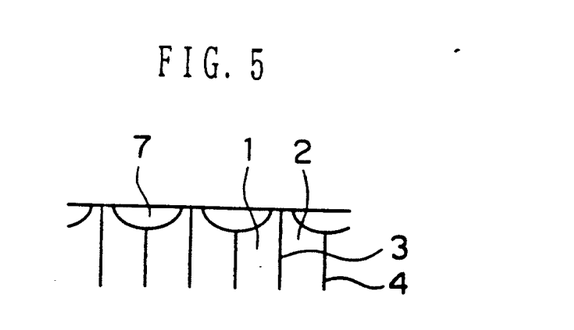
FIG. 5 is a schematic diagram showing a further machining step according to the invention.

As shown in FIG. 5, both side surfaces were lapped. Portions of the insulating layer 7 and all the nickel plating 5 were removed. In this manner, alternate layers of the fringes of the internal electrodes 3 and 4 were exposed at the side surfaces of the laminate.

Figure 6:
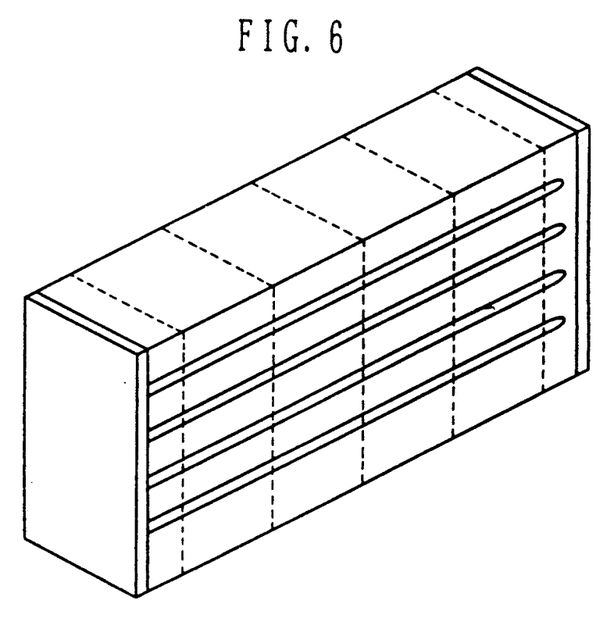
FIG. 6 is a schematic diagram showing a still other machining step according to the invention.
Figure 7:
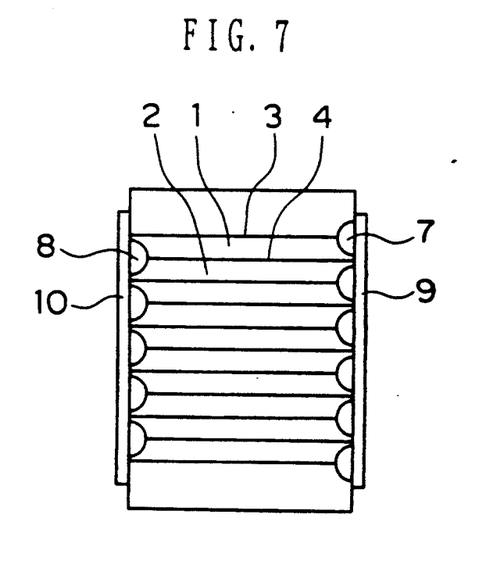
FIG. 7 is a cross-sectional view of a laminate according to the invention.

The laminate block obtained in this way was cut parallel to the temporary external electrodes indicated by the dotted lines as shown in FIG. 6 to derive individual devices. Then, as shown in FIG. 7, external electrodes 9 and 10 were formed. Connection with the corresponding internal electrodes 3 and 4 could be made. In the present example, all the metal protrusions deposited by the plating can be removed. Imperfect electrical connection due to oxidization of the metal protrusions and mechanical breakage can be prevented. Furthermore, the reliability of the insulation of the device can be improved greatly, because the insulating layer can be made sufficiently thick.

EXAMPLE 3

A laminate in which alternate layers of the internal electrodes were exposed at both sides as shown in FIG. 21 was created in the same way as in Example 2. Temporary external electrodes 13 and 14 were formed on both side surfaces.

Figure 8:
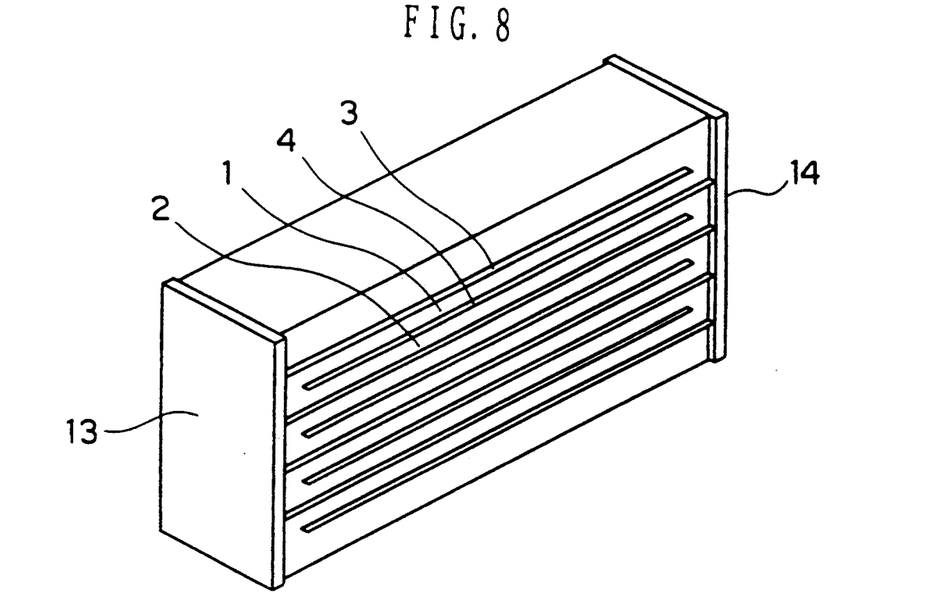
FIG. 8 is a perspective view of an alternate electrode laminate block, and in which the plated surface has been etched.

The upper and lower surfaces of the laminate at which neither the temporary external electrodes nor the internal electrodes were exposed were masked. As shown in FIG. 8, the ceramic on the surface which has to be plated with a metal was etched so that the internal electrodes protruded. The laminate was immersed in 10% solution of hydrochloric acid at 50° C. for 60 minutes to etch the ceramic up to a depth of 10 $\mu$m.

One of the side surfaces of the laminate not having the temporary external electrodes was masked with a masking reagent. Then, the opposite surface was plated with a metal in the same conditions as in the Example 2. Similarly, the side surfaces on the rear side were plated with the metal.

Figure 9:
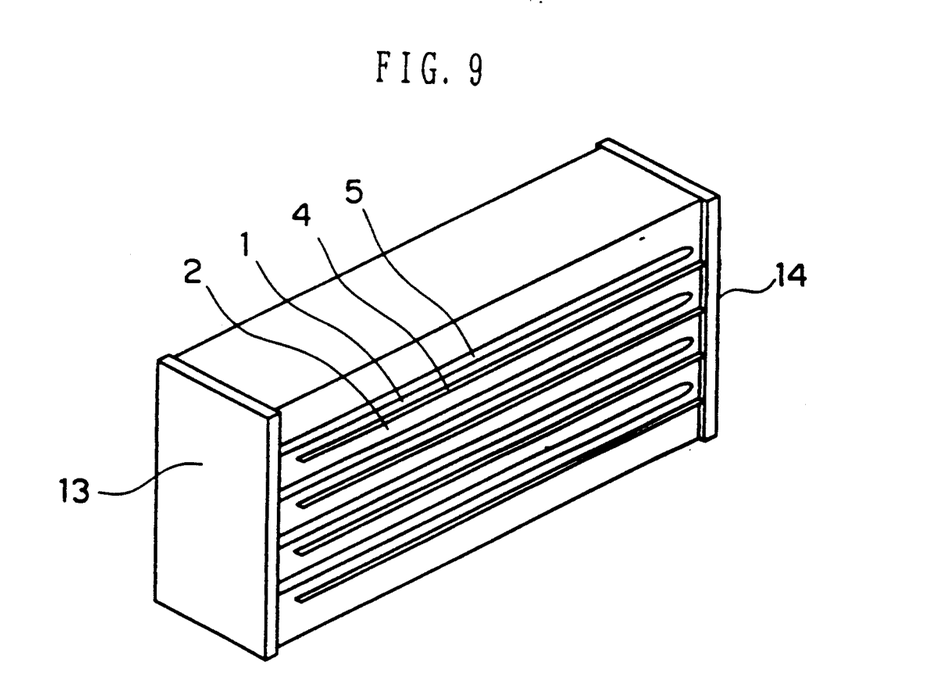
FIG. 9 is a perspective view of the alternate electrode laminate block, and in which alternate layers have been plated with a metal.
Figure 10:
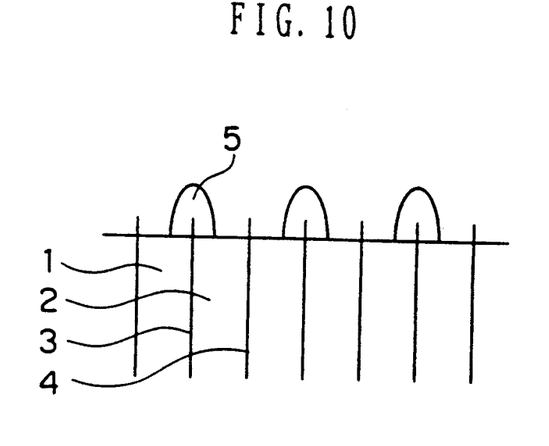
FIG. 10 is a schematic diagram showing a machining step according to the invention.

FIG. 9 is a perspective view of the laminate plated with nickel. FIG. 10 is a fragmentary cross section. In these figures, indicated by numeral 5 are belt-like deposits of nickel.

Figure 11:
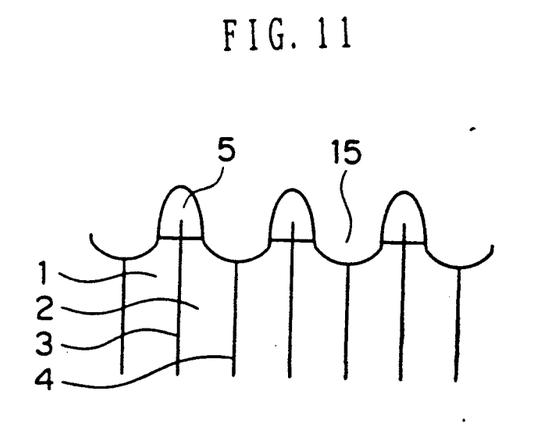
FIG. 11 is a schematic diagram showing another machining step according to the invention.
Figure 12:
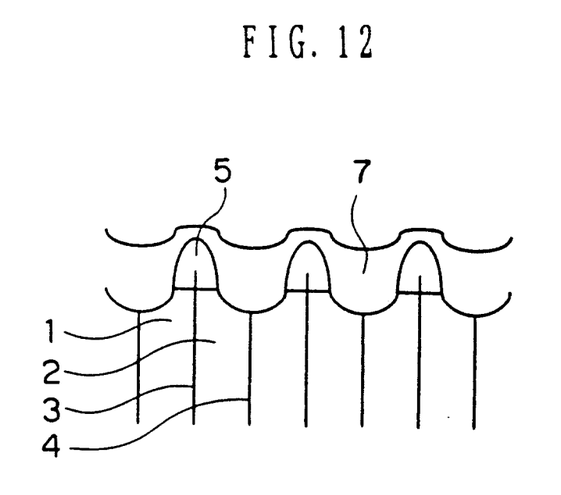
FIG. 12 is a schematic diagram showing a further machining step according to the invention.
Figure 13:
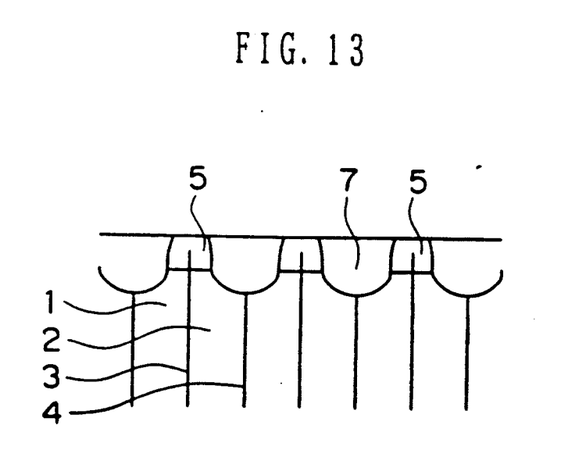
FIG. 13 is a schematic diagram showing a still other machining step according to the invention.

A shot blasting operation was effected, in the same manner as in Example 2, to form concave cutouts 15 as shown in FIG. 11. Then, as shown in FIG. 12, an insulating material 7 was applied to the shot-blasted surface and baked. Subsequently, as shown in FIG. 13, both side surfaces were lapped. The insulating layer 7 was partially removed to expose the nickel plating 5.

Figure 14:
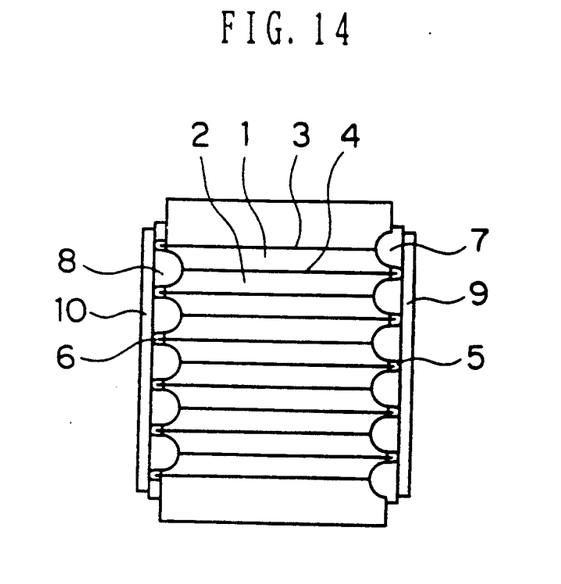
FIG. 14 is a cross-sectional view of a yet other laminate according to the invention.

The laminate block fabricated in this manner was cut into individual devices, in the same way as in Example 2. Then, as shown in FIG. 14, external electrodes 9 and 10 were formed. Connection with the corresponding internal electrodes 3 and 4 could be made.

In the present example, the deposited metal is bonded to the internal electrodes with great adhesive strength. Also, a sufficient thickness of insulating layer can be obtained without growing the deposited metal up to a large height. Consequently, the reliability of the insulation of the device can be enhanced greatly.

EXAMPLE 4

A laminate in which alternate layers of the internal electrodes were exposed at both side surfaces as shown in FIG. 21 was fabricated, in the same way as in Example 3. Temporary external electrodes 13 and 14 were formed on both side surfaces. Then, the upper and lower surfaces of the laminate at which neither the temporary external electrodes nor the internal electrodes were exposed were masked. The ceramic on the surface of the laminate to be plated with a metal was etched to cause the internal electrodes to protrude. The etching was carried out by immersing the laminate in 10% solution of hydrochloric acid at 50° C. for 60 minutes. In this way, the ceramic was etched up to 10 $\mu$m.

Then, one of the etched side surfaces of the laminate was masked with a masking reagent. Subsequently, the opposite surface was plated with a metal in the same conditions as in Example 2. As a result, belt-like deposits 5 each having a height of 50 $\mu$m and a width of 40 $\mu$m appeared on alternate layers of the internal electrodes.

The masked side surfaces on the rear side were plated with nickel in the same way as in the foregoing process to form a laminate of the structure shown in FIGS. 9 and 10 in the same manner as in Example 2.

Thereafter, a shot-blasting operation was carried out for 60 seconds in the same way as in Example 3 to form grooves about 120 $\mu$m deep. This permitted the distance W between the deposited metal 5 and the boundary between the electrostrictive-effect device 1 and the insulating layer 7 to be made substantially large, the boundary going to the internal electrodes 3 which differed in electrical polarity from the deposited metal 5 as shown in FIGS. 24 and 25. Consequently, the reliability of the insulation was improved.

As shown in FIG. 13, the surfaces on which the insulating layers 7 and 8 were formed were lapped to remove portions of the insulating layer 7 and to expose the nickel plating 5.

Then, the laminate was immersed in 10% solution of nickel chloride. The temporary external electrodes 13 and 14 were connected with the anode. A counter electrode plate made of nickel was connected with the cathode. A DC voltage was applied at a current density of 40 A/cm$^2$ for 30 minutes. The exposed metal deposits 5 and 6 of the laminate were removed by electrolytic etching.

Figure 15:
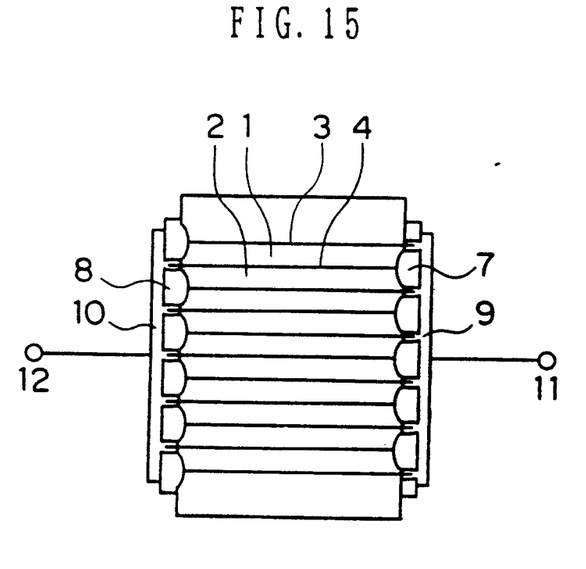
FIG. 15 is a cross-sectional view of an additional laminate according to the invention.

The laminate block obtained in this way was cut into individual devices, in the same way as in Example 2. Then, external electrodes 9 and 10 were formed as shown in FIG. 15 and connected with the corresponding internal electrodes 3 and 4.

The characteristics of a device fabricated by the prior art method and a device fabricated in accordance with the present invention are listed in Table 1. With the device fabricated by the prior art techniques in the same way as the structure shown in FIG. 9, the remaining nickel plating oxidizes. There exist some internal electrodes which are not connected with the external electrodes. Therefore, the electrostatic capacitance and the amount of displacement are smaller than those of the novel device.

TABLE 1

|  | electrostatic capacitance ($\mu$F) | amount of displacement ($\mu$m at 150 V) |
|---|---|---|
| novel | 0.580 | 10.9 |
| prior art | 0.362 | 6.8 |

In the present example, the metal protrusions deposited by plating can be all removed. Therefore, drawbacks such as imperfect electrical connection due to oxidization of the deposited metal and mechanical breakage can be prevented. The height of the internal electrodes can be increased by plating the internal electrodes which have been made to protrude by etching. Therefore, the thickness of the insulating layer can be made sufficiently large. Also, the area of the portions of the deposited metal in contact with the internal electrodes is increased. In consequence, the strength with which the deposited metal is bonded can be improved. Furthermore, the distance W between the deposited metal 5 and the boundary between the electrostrictive-effect layer 1 and the insulating layer 7 as shown in FIGS. 24 and 25 can be rendered substantially long, the layer 1 going to the internal electrodes 3 differing from the deposited metal 5 in electrical polarity. Hence the reliability of the insulation is improved.

In the above examples, the internal electrodes were made of platinum paste. Silver-palladium paste may also be employed. The belt-like metal deposits on the lamination was nickel. Other materials are also usable if electroplating is possible and if the plating liquid does not attack the electrostrictive-effect layer. Similar advantages can be obtained, using copper, iron, chromium, and tin, and other materials. Also in the above examples, acidic solution was used to cause the internal electrodes to protrude. Any other means may be adopted as long as it can selectively etch the electrostrictive material. For instance, ion etching can be utilized. Additionally, in the above examples, electrolytic etching was used as a means for removing the deposited metal. Those methods which are not used in the above examples may also be used. For example, chemical etching making use of an acidic solution or the like and ion etching may be employed.

I claim:

1. A method of fabricating a lamination-type displacement device, comprising the steps of:
forming thin films of an electromechanical transducer material alternately with internal electrodes of a conductive material to form a laminate in which the internal electrodes are exposed at different parallel side surfaces;
forming a protective film on and around alternate layers of the internal electrodes at one side surface;
forming a protective film on and around the internal electrodes other than said internal electrodes at the other side surface;
selectively polishing the side surfaces of the laminate except for the protective films; and
removing the protective films.

2. A method of fabricating a lamination-type displacement device, comprising the steps of:
forming sheets of an electrostrictive material alternately with internal electrodes to form a laminate having two opposite surfaces at which the ends of the internal electrodes are exposed and two other opposite surfaces at which alternate layers of the internal electrodes are exposed;
forming temporary external electrodes on the last-mentioned two opposite surfaces;
plating alternate layers of the exposed portions of the internal electrodes at one surface of the laminate with a metal while using one temporary external electrode as a cathode;
then plating the exposed portions of the internal electrodes of the laminate other than the plated surface and internal electrodes with a metal while using the other temporary external electrode as a cathode;
selectively removing the non-plated portions of the plated surface to form recesses;
forming insulating films on the recesses;
removing portions of the insulating films and all of the metal deposited to expose the internal electrodes; and
forming external electrodes for connection of the exposed internal electrodes.

3. A method of fabricating a lamination-type displacement device, comprising the steps of:
forming sheets of an electrostrictive material alternately with internal electrodes to form a laminate having two opposite surfaces at which the ends of the internal electrodes are exposed and two other opposite surfaces at which alternate layers of the internal electrodes are exposed;
forming temporary external electrodes on the last-mentioned two opposite surfaces;
etching electrostrictive material on the surfaces on which the temporary external electrodes are not formed to cause the internal electrodes to protrude;
plating alternate layers of the exposed portions of the internal electrodes at one surface of the laminate with a metal while using one temporary external electrode as a cathode;
plating the exposed portions of the internal electrodes of the laminate different from the plated surface with a metal while using the other temporary external electrode as a cathode;
selectively removing the non-plated portions on the plated surfaces to form recesses;
forming an insulating film on the recesses;
removing portions of the insulating film and portions of the deposited metal to expose the metal; and
forming external electrodes for connection of the exposed, deposited metal.

4. A method of fabricating a lamination-type displacement device comprising the steps of:
forming sheets of an electrostrictive material alternately with internal electrodes to form a laminate having two opposite surfaces at which the ends of the internal electrodes are exposed and two other opposite surfaces at which alternate layers of the internal electrodes are exposed:

forming temporary external electrodes on the last-mentioned two opposite surfaces;

etching the two other opposite side surfaces to cause the internal electrodes to protrude;

plating alternate layers of the exposed portions of the internal electrodes at one surface of the laminate with a metal while using one temporary external electrode as a cathode;

then plating the exposed portions of the internal electrodes of the laminate different from the plated surface and from the internal electrodes with a metal while using the other temporary external electrode as a cathode;

removing the protruding portions of the internal electrodes not plated and surrounding portions;

forming an insulating film on the non-plated portions of the plated surface;

removing portions of the insulating film to expose the deposited metal;

removing the exposed, deposited metal to expose alternate layers of the internal electrodes; and forming external electrodes.

5. The method of claim 3, wherein the step of removing portions of the insulating film and portions of the deposited metal to expose the metal comprises impinging abrasive particles on said insulating film and portions of the deposited metal.

6. The method of claim 4, wherein the steps of removing portions of the insulating film to expose the deposited metal and removing the exposed, deposited metal to expose alternate layers of the internal electrodes comprises impinging abrasive particles on said insulating film and portions of the deposited metal.

* * * * *